United States Patent
Lee et al.

(10) Patent No.: US 10,325,849 B2
(45) Date of Patent: Jun. 18, 2019

(54) DIFFERENT SCALING RATIO IN FEOL/ MOL/ BEOL

(71) Applicant: Taiwan Semiconductor Manufacturing Co., Ltd., Hsin-Chu (TW)

(72) Inventors: Liang-Yao Lee, Taoyuan (TW); Tsung-Chieh Tsai, Chu-Bei (TW); Juing-Yi Wu, Hsinchu (TW); Chun-Yi Lee, Beipu Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 687 days.

(21) Appl. No.: 15/016,448

(22) Filed: Feb. 5, 2016

(65) Prior Publication Data

US 2016/0155704 A1 Jun. 2, 2016

Related U.S. Application Data

(63) Continuation of application No. 14/082,487, filed on Nov. 18, 2013, now Pat. No. 9,292,649.

(51) Int. Cl.
*G06F 17/50* (2006.01)
*H01L 23/528* (2006.01)
(Continued)

(52) U.S. Cl.
CPC ...... *H01L 23/5283* (2013.01); *G06F 17/5068* (2013.01); *G06F 17/5081* (2013.01);
(Continued)

(58) Field of Classification Search
CPC ............. G06F 17/5081; G06F 17/5068; H01L 23/5283; H01L 23/5226; H01L 29/4916; H01L 2924/0002
(Continued)

(56) References Cited

U.S. PATENT DOCUMENTS 5,612,893 A 3/1997 Hao et al.
5,929,469 A * 7/1999 Mimoto ............ H01L 27/11807
257/207
(Continued)

OTHER PUBLICATIONS

Non-Final Office Action dated Jul. 9, 2015 for U.S. Appl. No. 14/082,487.
(Continued)

*Primary Examiner* — Jack Chiang
*Assistant Examiner* — Brandon Bowers
(74) *Attorney, Agent, or Firm* — Eschweiler & Potashnik, LLC

(57) ABSTRACT

In some embodiments, the present disclosure relates to an integrated chip. The integrated chip has a plurality of gate structures arranged over a substrate. A plurality of first MOL (middle-of-line) structures are arranged at a first pitch over the substrate at locations interleaved between the plurality of gate structures. The plurality of first MOL structures connect active regions within the substrate to an overlying metal interconnect layer. A plurality of second MOL structures are arranged at a second pitch over the plurality of gate structures at locations interleaved between the plurality of first MOL structures. The plurality of second MOL structures connect the plurality of gate structures to the metal interconnect layer. The second pitch is different than the first pitch. The different pitches avoid misalignment errors between the plurality of gate structures and the metal interconnect layer.

20 Claims, 4 Drawing Sheets

(51) Int. Cl.
*H01L 23/522* (2006.01)
*H01L 29/49* (2006.01)

(52) U.S. Cl.
CPC ...... *H01L 23/5226* (2013.01); *H01L 29/4916* (2013.01); *H01L 2924/0002* (2013.01)

(58) Field of Classification Search
USPC ........................................................ 716/118
See application file for complete search history.

(56) References Cited

U.S. PATENT DOCUMENTS

| | | | |
|---|---|---|---|
| 6,271,548 B1* | 8/2001 | Umemoto ......... | H01L 27/11803 257/202 |
| 6,756,242 B1* | 6/2004 | Regan ................ | G06F 17/5081 438/14 |
| 7,363,601 B2* | 4/2008 | Heng ................. | G06F 17/5068 716/122 |
| 7,442,637 B2* | 10/2008 | Su ....................... | H01L 23/5222 257/E21.477 |
| 2010/0264551 A1 | 10/2010 | Farooq et al. | |
| 2010/0289144 A1 | 11/2010 | Farooq et al. | |

OTHER PUBLICATIONS

Notice of Allowance dated Nov. 13, 2015 for U.S. Appl. No. 14/082,487.

* cited by examiner

DIFFERENT SCALING RATIO IN FEOL/ MOL/ BEOL

REFERENCE TO RELATED APPLICATION

This Application is a continuation of U.S. application Ser. No. 14/082,487 filed on Nov. 18, 2013, the contents of which are incorporated by reference in their entirety.

BACKGROUND

Over the last four decades, the density of integrated circuits (ICs) has increased according to a relation known as Moore's law. Moore's Law states that the number of transistors within an integrated circuit (IC) doubles from one technology node to another technology node (i.e., every 18 months), and consequently the chip area used for a fixed number of transistors is cut in half. The smaller sizes provide for silicon cost savings and increased IC performance (e.g., increased processing speed, memory capacity, etc.). In large part, this remarkable increase in the performance of ICs has ushered in the dawn of today's information age. However, unlike laws of nature, which hold true regardless of mankind's activities, Moore's law only holds true so long as innovators overcome the technological challenges associated with it.

DETAILED DESCRIPTION

Figure 1:
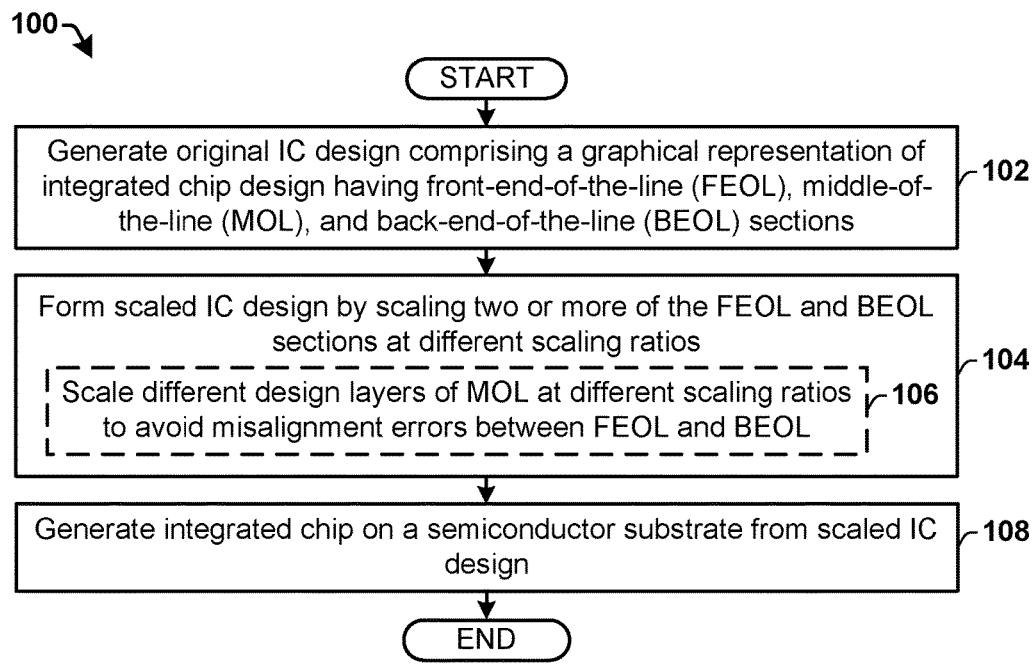
FIG. 1 illustrates a flow diagram of some embodiments of a method of generating a scaled integrated chip design having different FEOL and BEOL scaling ratios.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

In order to meet the demands of Moore's Law, the semiconductor industry has consistently generated integrated chip (IC) designs for a new processing node by scaling entire IC designs from a previous processing node by a scaling ratio of approximately 0.7. For example, a metal line having a width of 100 nm in an IC design for a 65 nm processing node would be scaled to have a width of 70 nm in an IC design for a 45 nm processing node.

As integrated chip minimum features sizes continue to decrease, it has been appreciated that scaling entire IC designs by a constant scaling ratio may be disadvantageous for a number of reasons. For example, for an integrated chip design having a lower back-end-of-the-line (BEOL) routing density and a higher front-end-of-the-line (FEOL) gate density, the BEOL pitch could be increased to improve RC performance of the integrated chip without increasing overall chip area. Furthermore, the difficulty in scaling FEOL and BEOL design layers are different, thereby resulting in increased processing difficulty to keep scaling factors the same.

Accordingly, the present disclosure relates to a method of generating a scaled integrated chip (IC) design by scaling a FEOL and a BEOL of an original IC design at different scaling ratios, and an associated apparatus. In some embodiments, the method is performed by forming an original integrated chip (IC) design that is a graphical representation of an integrated chip. The original IC design has a front-end-of-the-line (FEOL) section, a back-end-of-the-line (BEOL) section, and a middle-of-the-line (MOL) section that is disposed between the FEOL and BEOL sections. A scaled integrated chip design is formed by scaling (i.e., shrinking) the FEOL section and the BEOL section of the original integrated chip design at different scaling ratios, and by scaling different design layers within the MOL section at different scaling ratios to avoid misalignment errors between the FEOL section and the BEOL section.

FIG. 1 illustrates a flow diagram of some embodiments of a method 100 of generating a scaled integrated chip design having different FEOL and BEOL scaling ratios.

At 102, an original integrated chip (IC) design comprising a graphical representation of an integrated chip is formed. The original IC design comprises a front-end-of-the-line (FEOL) section comprising one or more semiconductor devices, a back-end-of-the-line (BEOL) section comprising metal interconnect layers, and a middle-of-the-line (MOL) section. The MOL section is disposed between the FEOL and BEOL sections and is configured to provide an electrical connection between the FEOL section and the BEOL section. The original IC design is associated with a first processing node (e.g., a 32 nm processing node).

At 104, a scaled integrated chip (IC) design is formed by scaling the FEOL section and the BEOL section of the original integrated chip design at different scaling ratios. For example, in some embodiments, the FEOL section may be scaled at a first scaling ratio (e.g., 0.7), while the BEOL section of the original integrated chip design may be scaled at a second scaling ratio greater than the first scaling ratio (e.g., 0.6). The scaled IC design is associated with a second processing node (e.g., a 22 nm processing node), which is smaller than the first processing node.

In some embodiments, different design layers of the MOL section may be scaled at different scaling ratios to avoid misalignment errors between the FEOL section and the BEOL section, at 106. For example, a first design layer of the MOL section may be scaled at the first scaling ratio, while a second design layer of the MOL section may be scaled at the second scaling ratio.

At 108, an integrated chip may be generated on a semiconductor substrate based upon the scaled IC design.

Figure 2:
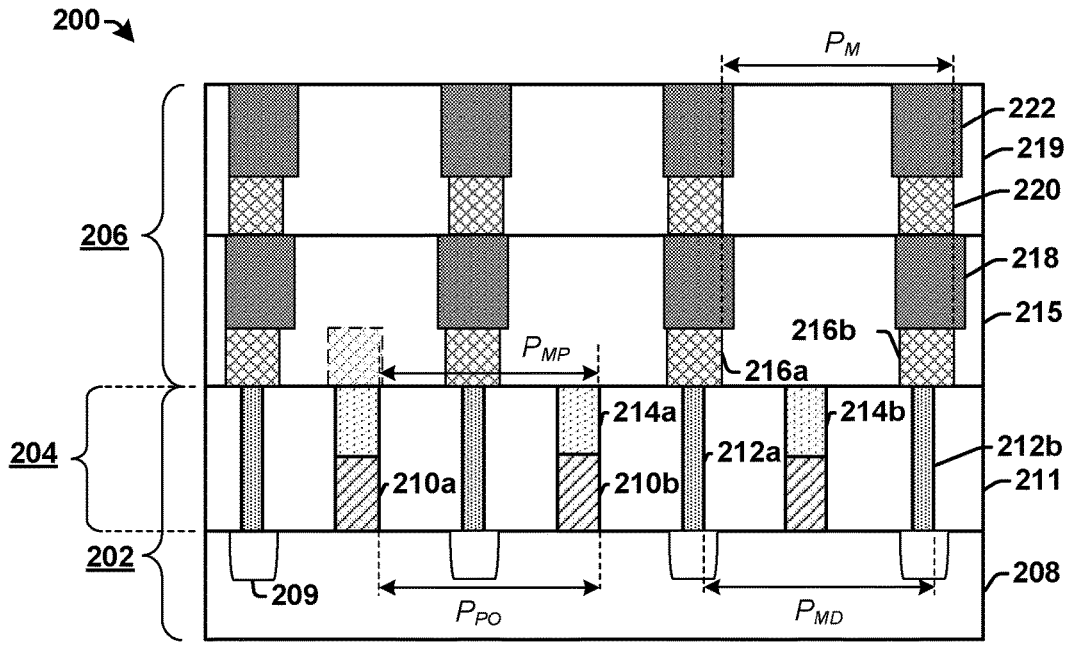
FIGS. 2-4 illustrate some embodiments of cross-sectional views of an integrated chip corresponding to a disclosed method of generating a scaled integrated chip design.
Figure 3:
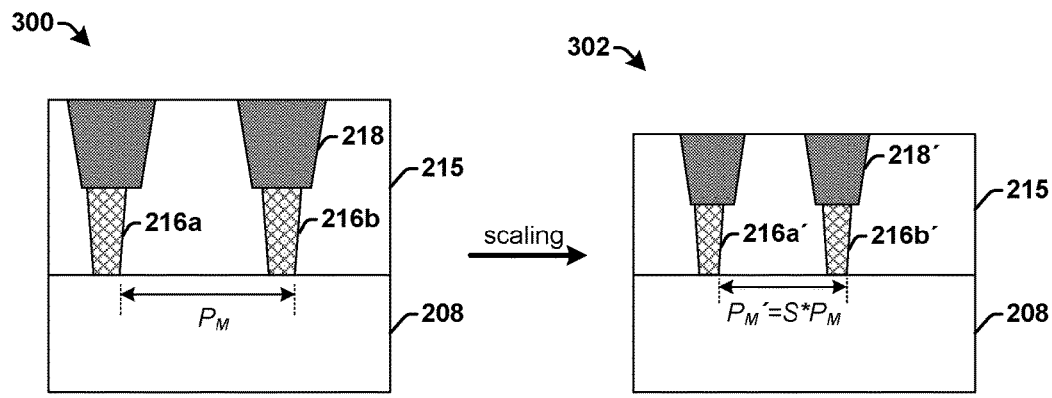
Figure 4:
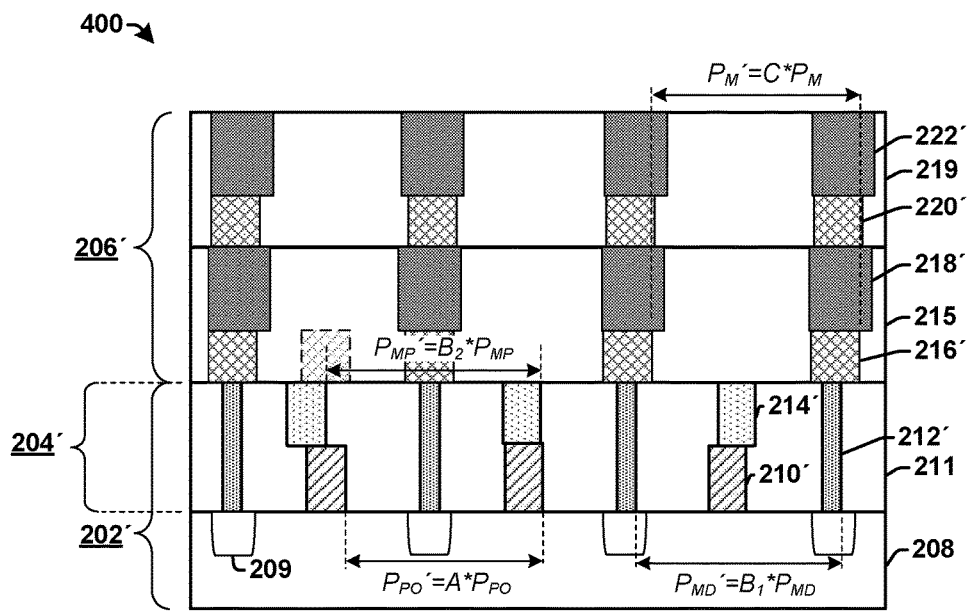

FIGS. 2-4 illustrate some embodiments of a cross-sectional view of an integrated chip corresponding to the disclosed method 100 of generating a scaled integrated chip design. Although FIGS. 2-4 are described in relation to method 100, it will be appreciated that the structures disclosed in FIGS. 2-4 are not limited to such a method, but instead may stand alone as an integrated chip.

FIG. 2 illustrates some embodiments of a cross-sectional view of an original integrated chip (IC) 200 corresponding to an original integrated chip (IC) design, which shows the different design layers of an original integrated chip.

The original IC 200 comprises a front-end-of-the-line (FEOL) section 202, a middle-of-the-line (MOL) section 204, and a back-end-of-the-line (BEOL) section 206. The FEOL section 202 comprises an active region design layer 209 and a gate design layer, such as a poly-silicon design layer 210, which is disposed within a dielectric material 211 located over a semiconductor substrate 208. The BEOL section 206 comprises a plurality of metal via design layers 216, 220 and metal wire design layers 218, 222 disposed within inter-level dielectric layers 215, 29. The MOL section 204 comprises a MD design layer 212 configured to connect the active region design layer 209 within the semiconductor substrate 208 to the first metal via design layer 216 (i.e., an active region contact) and a MP design layer 214 configured to connect the poly-silicon design layer 210 to the first metal via design layer 216 (i.e., a poly-silicon contact).

The design layers of the FEOL section 202, the MOL section 204, and the BEOL section 206 are set up to have design shapes that may be spaced according to pitches. For example, in the FEOL section 202 the poly-silicon design layer 210 comprises poly-silicon shapes that are spaced according to a poly-silicon pitch $P_{PO}$ that is equal to a distance between a first edge of a first poly-silicon shape 210a (e.g., a first poly-silicon gate) and a first edge of an adjacent poly-silicon shape 210b (e.g., a second poly-silicon gate). The MOL section 204 comprises a MD pitch $P_{MD}$ and a MP pitch $P_{MP}$. The MD pitch $P_{MD}$ is equal to a distance between a first edge of a first MD shape 212a and a first edge of an adjacent MD shape 212b. The MP pitch $P_{MP}$ is equal to a distance between a first edge of a first MP shape 214a and a first edge of an adjacent MP shape 214b. The BEOL section 206 comprises a metal routing pitch $P_M$. The metal routing pitch $P_M$ is equal to a distance between a first edge of a first metal shape (e.g., metal via shape 216a) and a first edge of an adjacent metal shape (e.g., metal via shape 216b). In some embodiments, the first metal via designs shapes connected to the MP design layer 214 are located on a different metal routing pitch than the first metal via design shapes connected to the MD design layer 212.

FIG. 3 illustrates some embodiments of cross-sectional views 300, 302 showing the scaling of a design layer of the original IC 200.

Cross-sectional view 300 illustrates metal shapes corresponding to an original IC design, which are spaced according to a metal routing pitch $P_M$ that is equal to a distance between a first edge of a first metal via shape 216a and a first edge of an adjacent metal via shape 216b. Cross-sectional view 302 illustrates scaled metal shapes corresponding to a scaled IC design, which are separated by a scaled metal routing pitch $P_M'$. The scaled metal routing pitch $P_M'$ has been shrunk by a scaling ratio S, so that the scaled metal routing pitch $P_M'$ is smaller than the original metal routing pitch $P_M$.

FIG. 4 illustrates some embodiments of a cross-sectional view corresponding to a scaled integrated chip (IC) 400 of a scaled IC design, which shows the different design layers of a scaled IC.

The scaled IC 400 comprises a FEOL section 202' having a scaled poly-silicon design layer 210' that has been scaled by a FEOL scaling ratio A with respect to the poly-silicon design layer 210 of the original IC design 200. The FEOL scaling ratio A is equal to the scaling ratio of the poly-silicon pitch between the original IC 200 and the scaled IC 400. In other words, FEOL scaling ratio A is equal to the scaled poly-silicon pitch $P_{PO}'$ divided by the original poly-silicon pitch $P_{PO}$.

The scaled IC 400 further comprises a BEOL section 206' having scaled metal interconnect design layers 216'-222' that have been scaled by a BEOL scaling ratio C with respect to the metal interconnect design layers 216-222 of the original IC 200. The BEOL scaling ratio C is equal to the scaling ratio of the metal layer pitch between the original IC 200 and the scaled IC 400. In other words, BEOL scaling ratio C is equal to the scaled metal layer pitch $P_M'$ divided by the original metal layer pitch $P_M$.

The scaled IC 400 further comprises a MOL section 204' having a scaled MD design layer 212' that has been scaled by a MD scaling ratio $B_1$ (i.e., a first MOL scaling ratio) with respect to the MD design layer 212 of the original IC 200 and a scaled MP design layer 214' that has been scaled by a MP scaling ratio $B_2$ (i.e., a second MOL scaling ratio) with respect to the MP design layer 214 of the original IC 200. The MD scaling ratio $B_1$ is equal to the scaling ratio of the MD pitch between the original IC 200 and the scaled IC 400 (i.e., the MD scaling ratio $B_1$ is equal to the scaled MD pitch $P_{MD}'$ divided by the original MD pitch $P_{MD}$). The MP scaling ratio $B_2$ is equal to the scaling ratio of the MP pitch between the original IC 200 and the scaled IC 400 (i.e., the MP scaling ratio $B_2$ is equal to the scaled MP pitch $P_{MP}'$ divided by the original MP pitch $P_{MP}$).

In some embodiments, the BEOL section 206' is scaled at a BEOL scaling ratio C that is greater than a FEOL scaling ratio A at which the FEOL section 202' is scaled. For example, in some embodiments, the FEOL scaling ratio A is in a range of between approximately 70% and approximately 80%, while the BEOL scaling ratio C is less than 70%. In some embodiments, the MD scaling ratio $B_1$ is equal to the FEOL scaling ratio C. In some embodiments, the MP scaling ratio $B_2$ is greater than the FEOL scaling ratio C.

Figure 5:
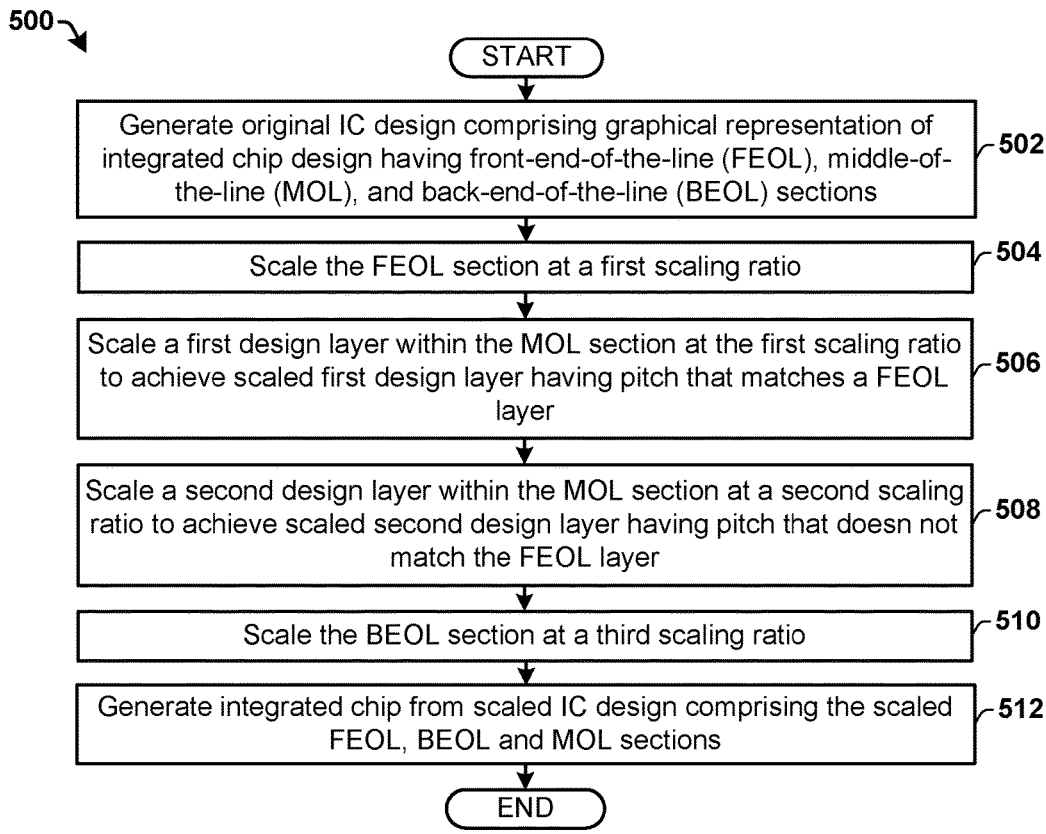
FIG. 5 illustrates a flow diagram of some alternative embodiments of a method of generating a scaled integrated chip design.

FIG. 5 illustrates a flow diagram of some alternative embodiments of a method 500 of generating a scaled integrated chip design having different FEOL and BEOL scaling ratios.

While disclosed methods (e.g., methods 100 and 500) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, an original integrated chip (IC) design comprising a graphical representation of an integrated chip is formed. The original IC design comprises a front-end-of-the-line (FEOL) section, a middle-of-the-line (MOL) section, and a back-end-of-the-line (BEOL) section. The original IC design is associated with a first processing node (e.g., a 32 nm processing node).

In some embodiments, the original IC design may be formed by a designer using a design software program. In some embodiments, the BEOL section may be formed by an automatic place and route tool configured to automatically place the shapes within the original IC design. In some embodiments, the original IC design may comprise a Graphic Database System (GDS) file, such as a GDS or GDSII file. In other embodiments, the original IC design may comprise a CIF file, an OASIS file, or some other similar file format, for example.

At 504, the FEOL section of the original integrated chip design is scaled according to a FEOL scaling ratio. In some embodiments, the FEOL section comprises a FEOL design layer comprising a poly-silicon gate design layer disposed over a semiconductor substrate. In some embodiments, the FEOL scaling ratio is in a range of between approximately 70% and approximately 80% of the original IC design.

At 506, a first design layer within the MOL section of the original IC design is scaled according to a first MOL scaling ratio. The first MOL scaling ratio achieves a scaled first design layer having a first pitch that matches a pitch of a FEOL design layer. In some embodiments, the first design layer comprises a MD design layer configured to connect an active region design layer (within a semiconductor substrate) to a first metal via design layer.

At 508, a second design layer within the MOL section of the original IC design is scaled according to a second MOL scaling ratio. The second MOL scaling ratio achieves a scaled second design layer having a second pitch that does not match a pitch of a FEOL design layer. In some embodiments, the second design layer comprises a MP design layer configured to connect a poly-silicon gate design layer to the first metal via design layer.

At 510, the BEOL section of the original integrated chip design is scaled according a BEOL scaling ratio that is different than the FEOL scaling ratio. In some embodiments, the BEOL section comprises a first metal via design layer, and a first metal wire layer disposed above the first metal via design layer.

At 512, an integrated chip may be generated on a semiconductor substrate based upon a scaled IC design comprising the scaled FEOL, BEOL, and MOL sections.

Figure 6:
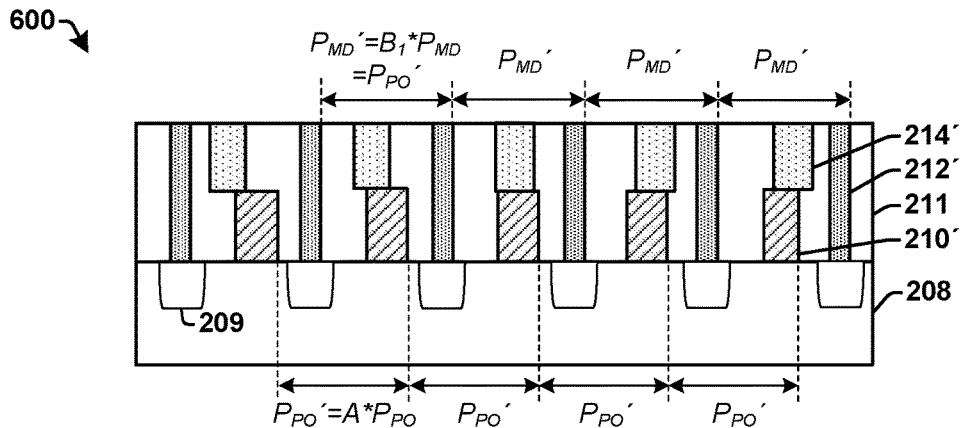
FIGS. 6-7 illustrate some embodiments of cross-sectional views of an integrated chip corresponding to a disclosed method of generating a scaled integrated chip design.
Figure 7:
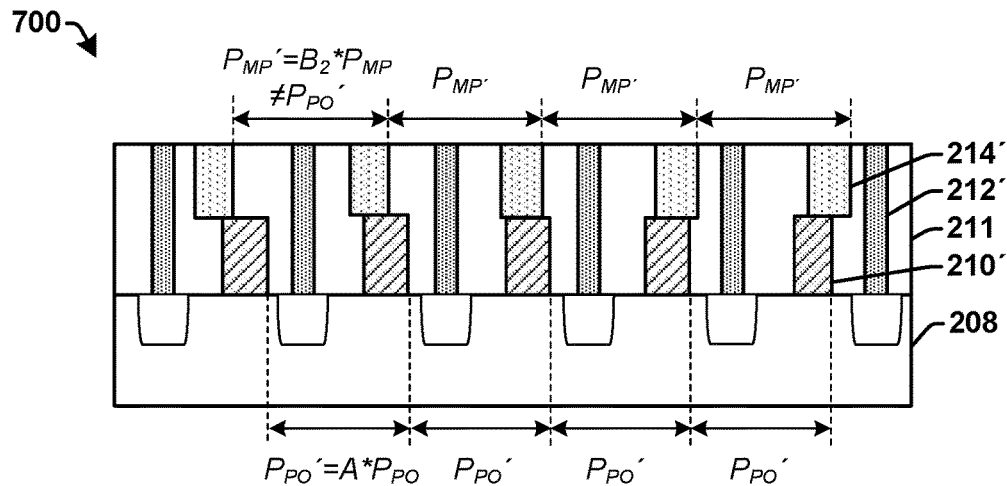

FIGS. 6-7 illustrate some embodiments of a cross-sectional view of an integrated chip showing a disclosed method of generating a scaled integrated chip design. Although FIGS. 6-7 are described in relation to method 500, it will be appreciated that the structures disclosed in FIGS. 6-7 are not limited to such a method.

FIG. 6 illustrates some embodiments of a cross-sectional view 600 of a scaled integrated chip corresponding to a scaled integrated chip design, which shows scaling of a MD design layer.

As shown in cross-sectional view 600, a poly-silicon gate design layer of an original IC design is scaled at a FEOL scaling ratio A to achieve a scaled poly-silicon gate design layer 210' having a scaled pitch $P_{PO}'$. The MD design layer of an original IC design is scaled at a MD scaling ratio $B_1$ to achieve a scaled MD design layer 212' having a pitch $P_{MD}'$ that matches the scaled pitch $P_{PO}'$ of the scaled poly-silicon design layer 210'. By scaling the MD design layer at a MD scaling ratio $B_1$ that causes the scaled MD design layer 212' to have pitch $P_{MD}'$ that matches a pitch $P_{PO}'$ of the scaled poly-silicon design layer 210', misalignment problems between the scaled MD design layer 212' and the scaled poly-silicon design layer 210' are avoided.

FIG. 7 illustrates some embodiments of a cross-sectional view 700 of an integrated chip corresponding to a scaled integrated chip design, which shows scaling of a MP design layer.

As shown in cross-sectional view 700, the MP design layer of an original IC design at a MP is scaled at a scaling ratio $B_2$ to achieve a scaled MP design layer 214' having a pitch $P_{MP}'$ that matches a scaled first metal via design layer (not shown) and that is different than the scaled pitch $P_{PO}'$ of the scaled poly-silicon design layer 210'.

Using different scaling ratios, $B_1$ and $B_2$, to respectively scale the MP and MD design layers, as shown in cross-sectional views 600 and 700, prevents misalignment problems between FEOL and BEOL sections of an integrated chip using different scaling ratio. This is because the $P_{MP}'$ pitch achieved by scaling the scaled MP design layer 214' by a scaling ratio $B_2$ has a value that allows for the scaled MP design layer 214' to electrically connect to both the scaled poly-silicon design layer 210' (scaled by a scaling ratio $B_1$) and a scaled first metal via design layer (scaled by a scaling ratio C), thereby preventing opens from occurring between the FEOL and BEOL. For example, in some embodiments, the $P_{MP}'$ pitch of the scaled MP design layer 214' may be a little bit larger than a pitch $P_{PO}'$ of the scaled poly-silicon design layer 210' and equal to a pitch of the scaled first metal via design layer, so that the scaled MP design layer 214' contacts the underlying scaled poly-silicon design layer 210' at different positions while maintaining electrical contact with the overlying first metal via design layer.

Figure 8:
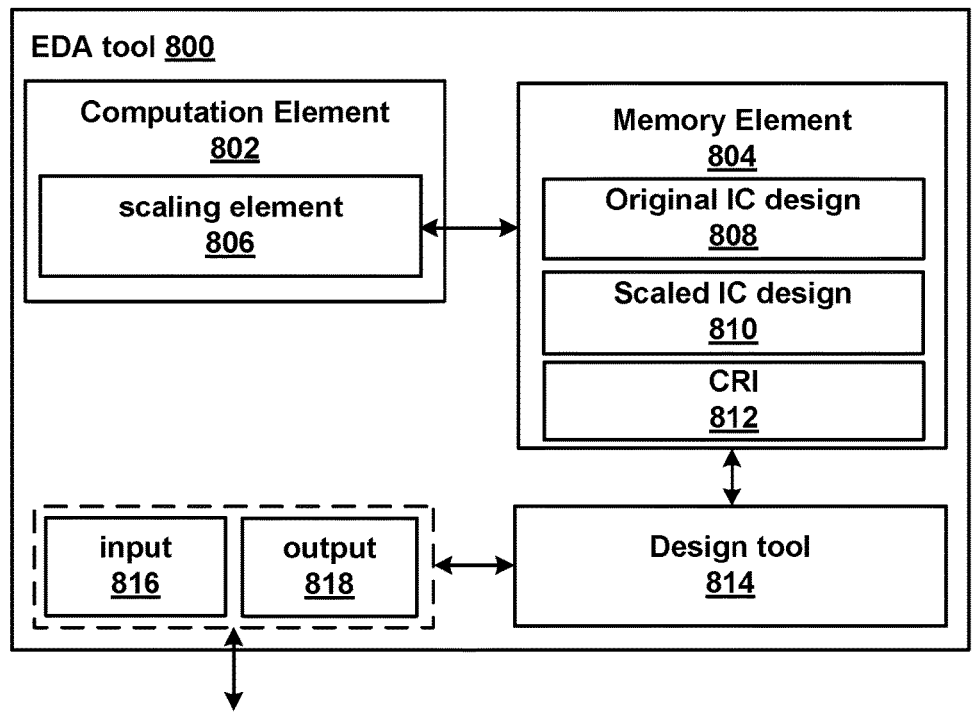
FIG. 8 illustrates a block diagram of some embodiments of an EDA (Electronic design automation) tool configured to execute the disclosed method of generating a scaled integrated chip design.

FIG. 8 illustrates a block diagram of some embodiments of an EDA (Electronic design automation) tool 800 configured to execute the disclosed method of generating a scaled integrated chip design.

The EDA tool 800 comprises a computation element 802 and a memory element 804. The computation element 802 comprises a scaling element 806. The memory element 804 is configured to store an original integrated chip (IC) design 808 (e.g., a GDS or GDSII file, a CIF file, or an OASIS file), a scaled integrated chip design 810, and computer readable instructions (CRI) 812 that may provide for a method of operating one or more components of the EDA tool according to a disclosed method (e.g., method 100 and/or 500). In various embodiments, the memory element 804 may comprise an internal memory or a computer readable medium.

The original integrated chip design 808 comprises a front-end-of-the-line (FEOL) section, a middle-of-the-line (MOL) section, and a back-end-of-the-line (BEOL) section. The FEOL section comprises a gate design layer, such as a poly-silicon design layer, which is disposed over a semiconductor substrate. The BEOL section comprises a first metal via design layer, and a first metal wire design layer disposed above the first metal via design layer. The MOL section comprises a MD design layer configured to connect the poly-silicon design layer to the first metal via design layer and a MP design layer configured to connect the semiconductor substrate to the first metal via design layer.

The scaling element 806 is configured to scale (i.e., shrink) the FEOL section and the BEOL section of the original integrated chip design 808 at different scaling ratios to form the scaled integrated chip design 810. In some embodiments, the scaling element is configured to scale the MD design layer of the original IC design at a MD scaling ratio to achieve a scaled MD design layer having a first pitch that matches a pitch of the poly-silicon design layer, and to scaling the MP design layer of the original IC design at a MP scaling ratio to achieve a scaled MP design layer.

In some embodiments, the EDA tool 800 may further comprises a design tool 814 configured to generate the original IC design 808. In some embodiments, the design tool 814 may comprise an automatic place and route tool configured to selectively route shapes on a plurality of design levels to generate the original IC design 808. In other embodiments, the design tool 814 may comprise a user interactive design environment that allows for designers to generate the original IC design 808. In such embodiments, the EDA tool 800 may comprise an input device 816 and/or an output device 818. The input device 816 is configured to allow a user to interact with the original IC design 808 and in various embodiments may comprise a keyboard, mouse, and/or any other input device. The output device 818 is configured to provide a graphical representation of the original IC design 808 that can be viewed by a user. In various embodiments, the output device 818 may comprise a monitor, for example.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another and for purposes of simplicity and ease of understanding, and that the actual dimensions and/or orientations may differ substantially from that illustrated herein.

The present disclosure relates to a method of generating a scaled integrated chip (IC) design by scaling a FEOL and a BEOL of an original IC design at different scaling ratios, and an associated apparatus.

In some embodiments, the present disclosure relates to an integrated chip. In some non-limiting embodiments illustrated in, for example, FIG. 4, the integrated chip 400 comprises a plurality of gate structures 210' arranged over a substrate 208. A plurality of first MOL (middle-of-line) structures 212' are arranged at a first pitch $P_{MD}'$ over the substrate 208 at locations interleaved between the plurality of gate structures 210'. The plurality of first MOL structures 212' are configured to connect active regions 209 within the substrate 208 to an overlying metal interconnect layer 216'. A plurality of second MOL structures 214' are arranged over the plurality of gate structures 210' at locations interleaved between the plurality of first MOL structures 212', and are configured to connect the plurality of gate structures 210' to the metal interconnect layer 216'. The plurality of second MOL structures 214' are arranged at a second pitch $P_{MP}'$ that is different than the first pitch $P_{MD}'$.

In other embodiments, the present disclosure relates to an integrated chip. In some non-limiting embodiments illustrated in, for example, FIG. 4, the integrated chip 400 comprises a plurality of gate structures 210' arranged over a substrate 208. The integrated chip 400 further comprises a plurality of first MOL (middle-of-line) structures 212' vertically extending from the substrate 208 to an overlying metal interconnect layer 216'. The plurality of first MOL structures 212' are arranged at a first pitch $P_{MD}'$. The integrated chip 400 further comprises a plurality of second MOL structures 214' laterally interleaved between the plurality of first MOL structures 212' and vertically extending from the plurality of gate structures 210' to the metal interconnect layer 216'. The plurality of second MOL structures 214' are arranged at a second pitch $P_{MP}'$ that is different than the first pitch $P_{MD}'$.

In yet other embodiments, the present disclosure relates to an integrated chip. In some non-limiting embodiments illustrated in, for example, FIG. 4, the integrated chip 400 comprises a plurality of gate structures 210' arranged over a substrate 208. The integrated chip 400 further comprises a plurality of first MOL (middle-of-line) structures 212' arranged at a first pitch $P_{MD}'$ and vertically extending from the substrate 208 to an overlying metal interconnect layer 216'. The integrated chip 400 further comprises a plurality of second MOL structures 214' laterally interleaved between the plurality of first MOL structures 212' and vertically extending from the plurality of gate structures 210' to the metal interconnect layer 216'. The plurality of second MOL structures 214' are arranged at a second pitch $P_{MP}'$ that is larger than a pitch $P_{PO}'$ of the plurality of gate structures 210' and equal to a pitch $P_M'$ of structures of the metal interconnect layer 216' over the plurality of second MOL structures 214'.

What is claimed is:

1. An integrated chip, comprising:
   a plurality of gate structures arranged over a substrate;
   a plurality of first MOL (middle-of-line) structures arranged at a first pitch over the substrate at locations interleaved between the plurality of gate structures, wherein the plurality of first MOL structures are configured to connect active regions within the substrate to an overlying metal interconnect layer; and
   a plurality of second MOL structures arranged over the plurality of gate structures at locations interleaved between the plurality of first MOL structures, and configured to connect the plurality of gate structures to the metal interconnect layer, wherein the plurality of second MOL structures are arranged at a second pitch that is different than the first pitch and wherein a horizontal plane that is parallel to an upper surface of the substrate extends through sidewalls of both the plurality of first MOL structures and the plurality of second MOL structures.

2. The integrated chip of claim 1, wherein the second pitch is larger than a pitch of the plurality of gate structures and equal to a pitch of structures of the metal interconnect layer over the plurality of second MOL structures.

3. The integrated chip of claim 1, wherein the plurality of second MOL structures physically contact uppermost surfaces of respective ones of the plurality of gate structures at different positions relative to centers of the respective ones of the plurality of gate structures.

4. The integrated chip of claim 1, wherein the metal interconnect layer comprises a metal via layer arranged between the plurality of first and second MOL structures and an overlying metal wire layer.

5. The integrated chip of claim 4, wherein the metal via layer comprises a first plurality of metal vias connected to the plurality of first MOL structures and a second plurality of metal vias connected to the plurality of second MOL structures, wherein the first plurality of metal vias have a different pitch than the second plurality of metal vias.

6. The integrated chip of claim 1, wherein the plurality of gate structures comprise polysilicon.

7. The integrated chip of claim 1, wherein the plurality of first MOL structures and the plurality of second MOL structures have upper surfaces that are substantially co-planar.

8. The integrated chip of claim 1,
wherein the plurality of second MOL structures have a first MOL feature straddling a first sidewall of a first one of the plurality of gate structures and a second MOL feature straddling a second sidewall of a second one of the plurality of gate structures; and
wherein the first sidewall and the second sidewall face opposite directions.

9. The integrated chip of claim 1, wherein opposing sides of one of the plurality of first MOL structures are laterally separated from closest ones of the plurality of second MOL structures by different distances measured along the horizontal plane.

10. The integrated chip of claim 1, wherein the first pitch is smaller than the second pitch.

11. An integrated chip, comprising:
a plurality of gate structures arranged over a substrate;
a plurality of first MOL (middle-of-line) structures vertically extending from the substrate to an overlying conductive interconnect layer, wherein the plurality of first MOL structures are arranged at a first pitch; and
a plurality of second MOL structures laterally interleaved between the plurality of first MOL structures and physically contacting upper surfaces of the plurality of gate structures, wherein the plurality of second MOL structures are arranged at a second pitch that is different than the first pitch.

12. The integrated chip of claim 11, wherein the second pitch is larger than a pitch of the plurality of gate structures and equal to a pitch of structures of the conductive interconnect layer over the plurality of second MOL structures.

13. The integrated chip of claim 11, wherein the conductive interconnect layer comprises a conductive via having a bottom surface contacting one of the plurality of first MOL structures and an upper surface contacting a conductive wire that extends past an outermost sidewall of the conductive via.

14. The integrated chip of claim 13, wherein the conductive interconnect layer comprises a first plurality of metal vias connected to the plurality of first MOL structures and a second plurality of metal vias connected to the plurality of second MOL structures, wherein the first plurality of metal vias have a different pitch than the second plurality of metal vias.

15. The integrated chip of claim 11, wherein the plurality of first MOL structures and the plurality of second MOL structures have upper surfaces that are substantially co-planar.

16. The integrated chip of claim 11, wherein the plurality of gate structures are arranged over the substrate in parallel to one another.

17. The integrated chip of claim 11, wherein the first pitch is smaller than the second pitch.

18. An integrated chip, comprising:
a plurality of gate structures arranged over a substrate;
a plurality of first MOL (middle-of-line) structures arranged at a first pitch and vertically extending from the substrate to an overlying metal interconnect layer;
a plurality of second MOL structures laterally interleaved between the plurality of first MOL structures and vertically extending from the plurality of gate structures to the metal interconnect layer, wherein the plurality of second MOL structures are arranged at a second pitch that is larger than a pitch of the plurality of gate structures and equal to a pitch of structures of the metal interconnect layer over the plurality of second MOL structures; and
wherein the plurality of second MOL structures have bottommost surfaces that are below topmost surfaces of the plurality of first MOL structures.

19. The integrated chip of claim 18, wherein the first pitch is different than the second pitch.

20. The integrated chip of claim 18, further comprising:
a first inter-level dielectric (ILD) layer laterally extending along a horizontal line between the plurality of first MOL structures and the plurality of second MOL structures, wherein the horizontal line is parallel to an upper surface of the substrate.

* * * * *